United States Patent [19]
Jolly

[11] Patent Number: 5,419,805
[45] Date of Patent: May 30, 1995

[54] SELECTIVE ETCHING OF REFRACTORY METAL NITRIDES

[75] Inventor: Gurvinder Jolly, Ontario, Canada

[73] Assignee: Northern Telecom Limited, Montreal, Canada

[21] Appl. No.: 198,708

[22] Filed: Feb. 18, 1994

Related U.S. Application Data

[63] Continuation-in-part of Ser. No. 854,021, Mar. 19, 1992, abandoned.

[30] Foreign Application Priority Data

Mar. 18, 1992 [CA] Canada ................................. 2063371

[51] Int. Cl.⁶ .......................... B44C 1/22; H01L 21/02
[52] U.S. Cl. ................................ 156/643.1; 437/200; 437/192
[58] Field of Search ............ 156/643, 656, 657, 659.1, 156/662; 437/178, 192, 200, 228, 241

[56] References Cited

U.S. PATENT DOCUMENTS 5,010,032 4/1991 Tang et al. .............................. 437/57
5,320,971 6/1994 Eklund et al. .................. 437/200 X

*Primary Examiner*—William Powell
*Attorney, Agent, or Firm*—Angela C. de Wilton

[57] ABSTRACT

A method of selectively etching a layer of a refractory metal nitride, with application to formation of TiN local interconnects for VLSI integrated circuits, and particularly a method of selectively etching TiN relative to a refractory metal silicide. The method comprises the step of heating surfaces of the substrate to a selected etch temperature between 50° C. and 200° C. in a non-reactive gas and then exposing the heated substrate to reactive halogen species of a plasma having ion energies substantially less than 100 eV, and preferably below 30 eV. The etch selectivity is controlled by selecting a relatively low ion energy to reduce ion bombardment and heating effects during etching, and independently controlling the etch temperature in the heating step. The reactive species of the plasma are preferably generated by electron cyclotron resonance (ECR) excitation of a halocarbon containing gas, and heating comprises ion bombardment with a non-reactive gas. For etching TiN, preferred halocarbon containing gases are CF4 and C2F6, and mixtures thereof, whereby optimum etch selectivity is obtained with reactive species having ion energies less than 30 eV, and at an etch temperature in the range 100° to 120° C.

27 Claims, 2 Drawing Sheets

SELECTIVE ETCHING OF REFRACTORY METAL NITRIDES

FIELD OF THE INVENTION

This application is a continuation-in-part of U.S. patent application Ser. No. 07/854,021 filed Mar. 19, 1992 in the name of G. Jolly and entitled "Selective Etching of Refractory Metal Nitrides", now abandoned.

This invention relates to selective etching of refractory metal nitrides.

BACKGROUND OF THE INVENTION

In fabrication of VLSI integrated circuits, the use of local interconnects provides for direct local connection between, for example, the source and drain junctions and/or gate electrodes of transistors, without additional contacts and metal layers, and allows for more compact layouts and circuit design. With the widespread use of self-aligned silicidation for source and drain contact metallization, a conductive film of a refractory metal nitride, for example titanium nitride (TiN), is a preferred material for local interconnects. Whereas silicides allow diffusion of boron and phosphorus, resulting in interdiffusion and counterdoping problems, a thin conductive film of TiN, or other refractory metal nitride such as tungsten nitride, is also an effective diffusion barrier.

For example, a known process for forming local interconnects with TiN may include the following process steps:

a. deposition overall of a titanium layer;
b. self aligned silicidation of exposed source, drain, and gate regions in a nitrogen atmosphere to form titanium silicide with overlying layer of titanium nitride (TIN);
c. removal of the TiN layer formed during silicidation;
d. deposition of a layer of conductive TiN;
e. coating and patterning of photoresist to mask selected areas of TiN for interconnect; and
f. etching of the exposed titanium nitride layer to leave TiN interconnects in selected areas.

A conductive titanium nitride film for interconnect may comprise stoichiometric TiN, but the composition may also contain oxygen and/or other elements. Thus, in this application, titanium nitride is denoted by the formula TiN to reflect a composition of approximately 50% titanium with nitrogen, and is not intended to be limited only to stoichiometric TiN. An etch process for defining the local interconnects must have selectivity to interconnect material, e.g. TiN, relative to underlying silicide to prevent degradation of the latter during etching. Commonly used silicides include $TiSi_2$, $CoSi_2$, and $PtSi_2$. Etch selectivity is also required relative to other substrate materials including oxides, photoresist encountered in semiconductor processing.

It is well known that a simple halogen containing discharge, and in particular a fluorine discharge, is effective for reactive ion etching of refractory metal nitrides, particularly TiN. However, a halogen discharge does not provide etch selectivity relative to $TiSi_2$ and other refractory metal silicides, such as $WSi_2$ and $MoSi_2$ or Various processes are known which have sought to provide improved etch selectivity for titanium nitride relative to silicides and other integrated circuit substrate materials using plasma or reactive ion etching with fluorine containing gases.

For example, a known method of selectively etching TiN relative to titanium silicide is disclosed in U.S. Pat. No. 4,675,073 to Douglas, which describes a dry etch process using a conventional plasma etching system providing a glow discharge plasma containing reactive fluorine species, provided by a feed gas comprising $CF_4$ in helium. The process takes advantage of the passivation effect of adsorption of $CF_2 \bullet$ radicals, formed by dissociation of $CF_4$, which are preferentially adsorbed on the silicide so as to hinder etching of the silicide by fluorine radicals. However, it was found that selectivity between TiN and $TiSi_2$ is low, and both oxide and photoresist were rapidly etched. It was also found that the high energy ions generated in a conventional plasma etch system, with ion energies typically $\sim 100$–250 eV, may cause surface damage to exposed silicide and other substrate materials during overetching near the end point. Thus, to avoid substrate damage and improve control of the endpoint, a dry etch step using a fluorine plasma is typically used to etch about 90% of the total thickness of TiN, and the remaining thickness of TiN is removed to the endpoint, with a subsequent wet etch. The latter comprises, for example an aqueous solution of dilute $H_2O_2$ and $NH_4OH$. Nevertheless, this wet etch solution also attacks photoresist, necessitating stripping of photoresist prior to the wet etch. Consequently, the wet etch step is not selective and after removing the photoresist the overall thickness of the exposed TiN, i.e. that for forming the interconnect, is also reduced during the wet etch. Furthermore, while $NH_4OH/H_2O_2$ is suitable for stripping or cleaning TiN, the etching rate is not sufficiently controllable for repeatably removing a small thickness of TiN.

Other fluorine containing feed gases, for example, $CHF_3$, $C_2F_6$ and $SF_6$, have been used for non-selective dry etching of titanium nitride, as described in U.S. Pat. No. 4,877,482 to Knapp et al. However, the '073 patent to Douglas teaches that a gas which is a copious fluorine source, e.g. $SF_6$, is unsuitable for selective etching, because the etch selectivity of TiN relative to $TiSi_2$ is reduced in the presence of excess fluorine. Consequently, Douglas found that it was advantageous (see Douglas '073 patent discussed above) for improved selectivity to use a low flow rate of a non-copious fluorine source gas, i.e. $CF_4$ in helium with a reducing electrode to scavenge fluorine and maintain fluorine deficiency in the plasma.

In two other recent U.S. Pat. Nos. 4,863,559 and 4,793,896 to Douglas, a method is described which provides improved etch selectivity using a plasma photo-generated from a gas mixture of $CCl_4$ and helium, in which excess chlorine is reduced by use of a consumable power electrode or by introducing a chlorine scavenger gas such as chloroform into the reactor.

In U.S. Pat. No. 4,878,994 to Jucha, there is described another chlorine based process for selective etching of Ti containing film, such as TiN, with respect to silicide which utilizes a plasma generated from a helium and $CCl_4$, in a plasma etching system which provides for a two stage plasma generation process to improve control of the etch anisotropy, selectivity and etch rate, compared to the method of the Douglas '073 patent, so that a subsequent wet etch step is unnecessary.

However, in use of a chlorine bearing gas for etching TiN, the reaction product is titanium chloride, which is less volatile than the corresponding fluoride. Thus a fluorine plasma is preferred to reduce residues and increase etch rate. There may also be problems associated with residual interfacial deposits left on surfaces parallel to the ion flux and caused by chlorine plasma reactions with $SiO_2$. Further, plasma etching with $CCl_4$ causes increased polymerization of resist material which necessitates a special resist strip. Use of a graphite electrode to scavenge chlorine may result in carbon contamination and further polymerization. Thus, it is preferred for microelectronics applications to avoid an etchant gas containing reactive chlorine species, which may result in contamination problems, as well as for reasons of health and environmental concerns associated with chlorinated gases.

Thus although the use of refractory metal nitrides as interconnect materials provides a significant advantage in simplifying circuit layout in VLSI integrated circuits, it is believed that the lack of selectivity of known etch processes may be a significant factor limiting more widespread use of refractory metal nitride local interconnects.

SUMMARY OF THE INVENTION

The present invention seeks to provide a method of selectively etching refractory metal nitrides, which avoids or reduces the above mentioned problems.

According to one aspect of the present invention, there is provided a method of selectively etching a layer of refractory metal nitride relative to an underlying layer of refractory metal silicide comprising part of a substrate of an integrated circuit, the method comprising:

heating surfaces of the substrate in a non-reactive gas to a selected etch temperature between 50° C. and 200° C. in an etching chamber;

generating a plasma from a halocarbon feed gas, the plasma comprising chemically reactive halogen species having ion energies in a predetermined range substantially below 100 eV;

exposing the heated surface of the substrate to said chemically reactive halogen species of the plasma at said selected etch temperature, thereby selectively removing the layer of refractory metal nitride from the underlying refractory metal silicide and the underlying substrate, the etch selectivity for the refractory metal nitride relative to the refractory metal silicide and substrate being controlled by selecting a relatively low ion energy whereby ion bombardment and heating effects during etching are reduced, and independently controlling the etch temperature by said heating step.

Thus, an etch process is provided with improved selectivity by restricting the ion energy of the incident plasma to substantially less than 100 eV, so that ion bombardment and heating effects of the plasma are reduced, while etch temperature is controlled independently in a heating step. Ion energies of the reactive species are beneficially selected in the range below 50 eV and preferably below 30 eV. A satisfactory etch rate is maintained by heating the substrate to a selected etch temperature above 50° C., in an independent heating step before exposure to the reactive halogen species of the plasma.

The substrate is heated conveniently in the etching chamber by ion bombardment of exposed surfaces with a non reactive gas, e.g. nitrogen, prior to the etching steps, and then the etch process is carried out while the substrate surface is still at an elevated temperature.

Alternatively, other conventional heating means such as a heated chuck may be used to provide an selected substrate temperature during etching. However, the former method has the advantage of heating the surfaces where etching takes place while maintaining a low bulk temperature of the substrate.

Thus, improved etch selectivity is provided by preheating the substrate and selecting the energy of the ions of the etchant plasma incident on the substrate so that the ion energy is sufficient preferentially attack and etch the nitride at a significantly higher rate than the silicide.

Advantageously, the process of generating the plasma is carried out in an ECR excited plasma etching system in which the ion energy of the reactive species of the plasma incident on the substrate can be controlled independently of the ion flux, for example by applying an RF bias to the substrate. The RF bias may be reduced, or turned off during the etching, i.e. the ECR etcher is operated in a plasma stream mode, so that the ion energy of reactive species incident on the substrate during etching is minimized. However, during the heating step, by increasing the RF bias, ion bombardment with relatively high energy unreactive gas ions is feasible, to provide for rapid heating.

A plasma comprising reactive species with selected low ion energy range may also be generated in other known systems, for example magnetron reactive ion etch system. Alternatively the plasma may be generated in a barrel type etcher, e.g. of the type used as a photoresist stripper which is provided with means for heating the substrate, i.e. a heated wafer support chuck.

According to another aspect of the present invention there is provided a method of forming a refractory metal nitride interconnect structure for an integrated circuit, the method comprising:

providing a substrate of an integrated circuit comprising a layer of a refractory silicide and an overlying layer of refractory metal nitride;

selectively masking the refractory metal nitride layer with a masking layer;

exposing the substrate in an etching chamber;

preheating surfaces of the substrate to a selected etch temperature between 50° C. and 20° C. in an unreactive gas;

generating a plasma from a halocarbon feed gas, the plasma comprising reactive halogen species having ion energies in a predetermined range substantially less than 100 eV;

and exposing the heated substrate to said reactive halogen species of the plasma at the selected etch temperature, thereby selectively removing unmasked areas of the layer of refractory metal nitride from the underlying layer of refractory metal silicide and underlying substrate.

the etch selectivity of the reactive species of the plasma for the refractory metal nitride relative to the refractory metal substrate, the underlying substrate and the masking layer being controlled by selecting a relatively low ion energy whereby ion bombardment and heating effects during etching are reduced and independently controlling the selected etch temperature in said preheating step.

A method of etching a refractory metal nitride relative to a refractory metal silicide which also provides improved etch selectivity relative to other materials used integrated circuits fabrication, is beneficial for fabrication of conductive refractory metal nitride interconnect structures for integrated circuits.

According to another aspect of the present invention there is provided a method of etching titanium nitride relative to an underlying layer of a refractory metal silicide comprising part of a substrate of an integrated circuit, comprising:

exposing the substrate in an etching chamber and heating surfaces of the substrate to a selected etch temperature between 50° C. and 200° C.;

generating a plasma from a halocarbon gas selected from the group consisting CF$_4$, C$_2$F$_6$, and mixtures thereof, the plasma comprising reactive fluorine species having ion energies in a predetermined range substantially below 100 eV, and exposing the heated substrate at the selected etch temperature to said reactive fluorine species, thereby selectively etching the layer of titanium nitride relative to the refractory metal silicide, the etch selectivity increasing at lower ion energies whereby an optimum etch selectivity is controlled by selecting a lower range of ion energy whereby heating effects and ion bombardment effects during etching are reduced, and independently controlling the etch temperature in said heating step.

Where the refractory metal nitride is titanium nitride, a preferred etchant plasma comprises a chemically reactive fluorine species produced from a feed gas containing CF$_4$, C$_2$F$_6$ or mixtures thereof. These fluorocarbon gases may be obtained with high purity for microelectronics applications.

Using an etch gas comprising CF4, and with suitable control of the ion energy and temperature, selective etch rates of titanium nitride relative to titanium silicide of 6:1 and for titanium nitride relative to cobalt silicide of 15:1 were obtained. Good etch selectivity for TiN with respect to photoresist ($\sim$7:1) and oxide of ($\sim$4:1) respectively was also achieved. Consequently the method is particularly applicable for selective etching in microelectronics applications.

Thus the present invention provides a method of selectively etching refractory metal nitrides, a method of selectively etching TiN, and a method of formation of a refractory metal nitride interconnect structure, which overcome or reduce the above mentioned problems.

BRIEF DESCRIPTION OF THE DRAWINGS

Embodiments of the invention will now be described by way of example, with reference to the accompanying drawing, in which.

DESCRIPTION OF THE PREFERRED EMBODIMENTS

Figure 1:
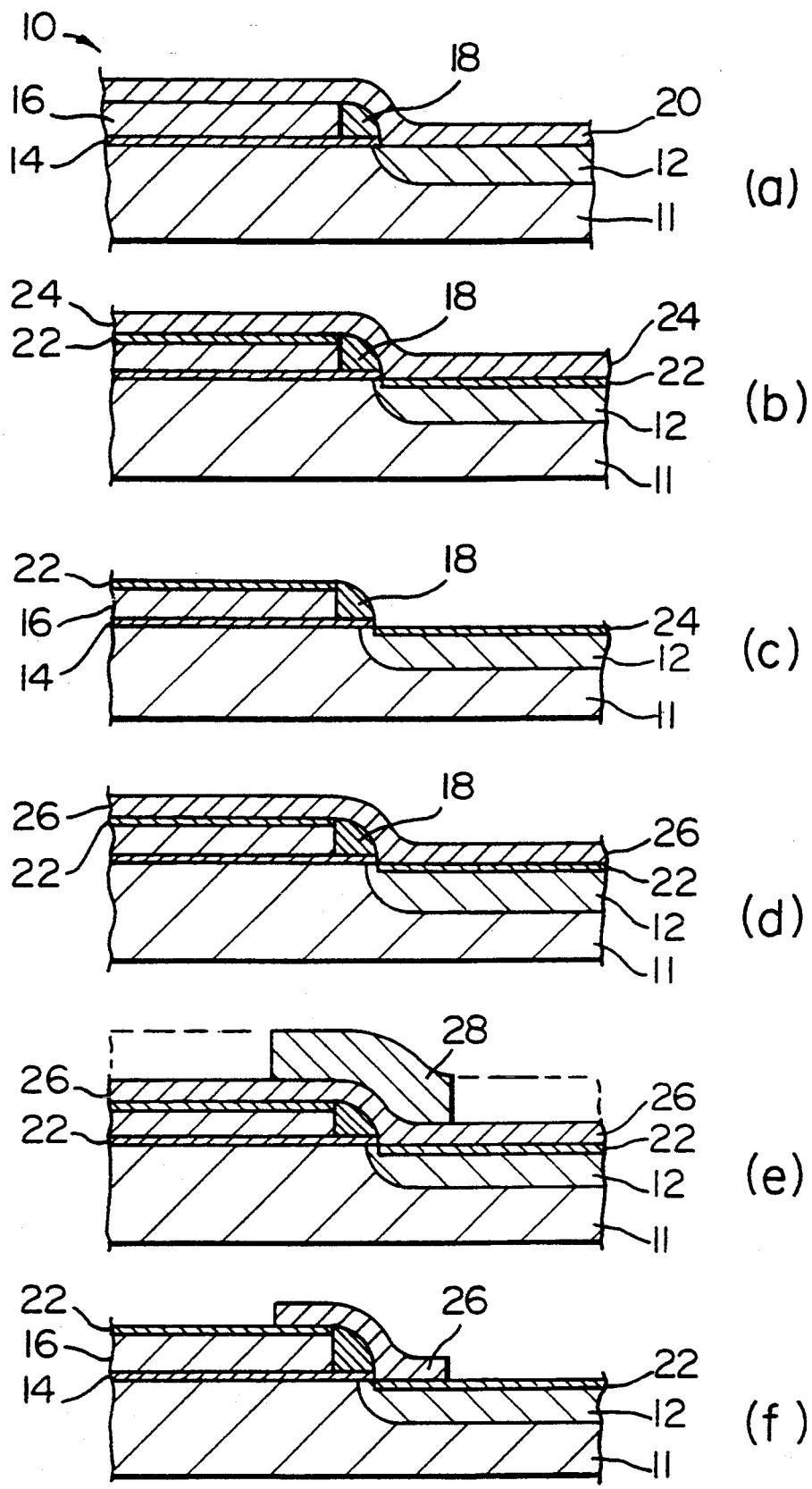
FIGS. 1a) to 1f) shows cross sectional views through part of an integrated circuit structure at successive process steps of a method according to a first embodiment of the present invention.

A cross sectional view of a part of an integrated circuit structure 10 at successive process steps of a method of forming TiN local interconnects for CMOS device structures, including process steps for selective etching of TiN according to a first embodiment of the present invention, is shown in FIG. 1a) to f). The partially fabricated integrated circuit structure 10 forms part of a substrate comprising a semiconductor silicon wafer 12 on which are defined parts of a conventional CMOS device, i.e. a transistor, which include doped silicon source and drain regions 12, a thin gate oxide 14, and a polysilicon gate electrode 16 having a dielectric sidewall spacer 18.

After formation of device structures on the substrate wafer, self-aligned silicidation of selected silicon source and drain regions 12 and polysilicon gate regions 16 is performed by a known method, by deposition of a film of titanium 20 and heating of the titanium film in a nitrogen atmosphere, which results in formation of titanium silicide 22 contact areas where the titanium film overlies exposed silicon of the source, drain and gate regions, and some nitridation of the titanium film occurs to form a film of titanium nitride TiN 24 overall. (FIG. 1a and 1b) This latter TiN film 24 is removed by wet etching in a mixture of NH$_4$OH and H$_2$O$_2$ (FIG. 1c). A thin layer 26 of a controlled thickness ($\sim$800 Å) of conductive TiN is then deposited on the wafer by a suitable method, i.e. by reactive sputtering (FIG. 1e). The conductive TiN layer 26 is selectively masked by coating and patterning of photoresist 28 (FIG. 1e). Exposed parts of the TiN layer 26 are then selectively removed by etching in an ECR excited plasma etching system by exposure of the substrate wafer to a plasma containing a reactive fluorine species, as will be described in detail below, to leave desired regions of conductive TiN 26 forming local interconnects between the source and drain regions and the gate electrode (FIG. 1f).

A suitable known apparatus for carrying out the method according to a first embodiment of the invention comprises an ECR excited plasma etching system of known prior art structure (not shown), having a first chamber for generation of a plasma by ECR excitation of a suitable feed gas. Chemically reactive species of the plasma including radicals and ions are then directed into an adjoining etching chamber. The etching chamber provides a substrate holder which includes means for applying an RF bias to the substrate for controlling the ion energy of reactive species directed from the plasma excitation chamber and incident on a sample held on the substrate holder in the adjoining etching chamber. Typically, the system may be evacuated to a base pressure of $\sim$10-3-10-4 Torr. Feed gas inlets into the plasma excitation chamber provides for one or more gases to be introduced at a controlled flow rate. While the flux of ions is dependent on the power supplied to the ECR plasma excitation chamber, which generates a high flux of highly electronically excited radicals and ions, the ion energy of the ions incident on the substrate may be independently controlled by adjusting the RF bias on the substrate. The ECR etcher may operated in a plasma stream mode, i.e. in the absence of RF bias on the substrate, to minimize the energy of ions incident on the substrate, or with an RF bias applied to the substrate, to accelerate ions towards the substrate and thereby increase the ion energy of reactive species of the plasma incident on the sample substrate.

Selective etching of the TiN layer was carried out as will now be described. After formation of the conductive TiN layer, the resist patterned wafer was placed in the ECR etching chamber, which was then evacuated. The sample was heated to a predetermined temperature between $\sim$50° C. and $\sim$150° C. by exposure to ion bombardment with a non-reactive gas, e.g. nitrogen. The nitrogen flow rate, and power levels were selected to obtain a controlled rate of heating. For example, ion bombardment using a nitrogen flow rate of 15 sccm N2, ECR excitation with microwave power of 600 W, magnet current of 16 Amp, and RF bias of 100 volts on the substrate holder heated the surfaces of the wafer to 120° C. in 3 minutes. The rate of temperature rise was controlled by altering the RF bias on the substrate during nitrogen ion bombardment. Immediately after heating the wafer, the nitrogen flow and the RF bias were turned off, the feed gas was changed to a desired fluorocarbon containing gas, that is, pure $CF_4$, and a plasma was generated which contained reactive fluorine species for etching TiN. The heated substrate was exposed to the reactive fluorine species of the plasma while the wafer remained at the selected etch temperature, to selectively remove TiN from the underlying silicide and other substrate materials. Etching was carried out over a range of parameters including gas flow rates, microwave power and magnet current, RF bias, and substrate temperature. Advantageously the etch selectivity may be controlled by appropriate selection of the ion energy and the etch temperature, so that etching of the TiN layer may proceed to the endpoint, to expose the underlying silicide layer.

Ion flux depends on ECR microwave excitation and magnet current which produces ions and radicals with a high electron temperature, but a low ion energy, 10–20 eV. The RF field on the substrate holder was used to control the ion energy independently of ion flux. Etch rates for TiN were measured in the absence of an applied RF bias, when the energy of ions incident on the substrate was 10–20 eV, and over a range of ion energies up to ~100 eV, comparable with ion energies of a conventional plasma etch system, by increasing the applied RF bias on the substrate.

While a range of flow rates of pure $CF_4$ and $CF_4$ in nitrogen were be used, it was found that at low gas flow rates up to ~20 sccm, the supply of $CF_4$ was apparently rate limiting, and an inert diluent gas, such as nitrogen, was not required. For example, a flow rate of 20 sccm pure $CF_4$, microwave excitation power of 250 W, and magnet current was of 16 A found to provide a high TiN etch rate of ~150 nm/min when the RF bias on the substrate was turned off during etching.

Figure 2:
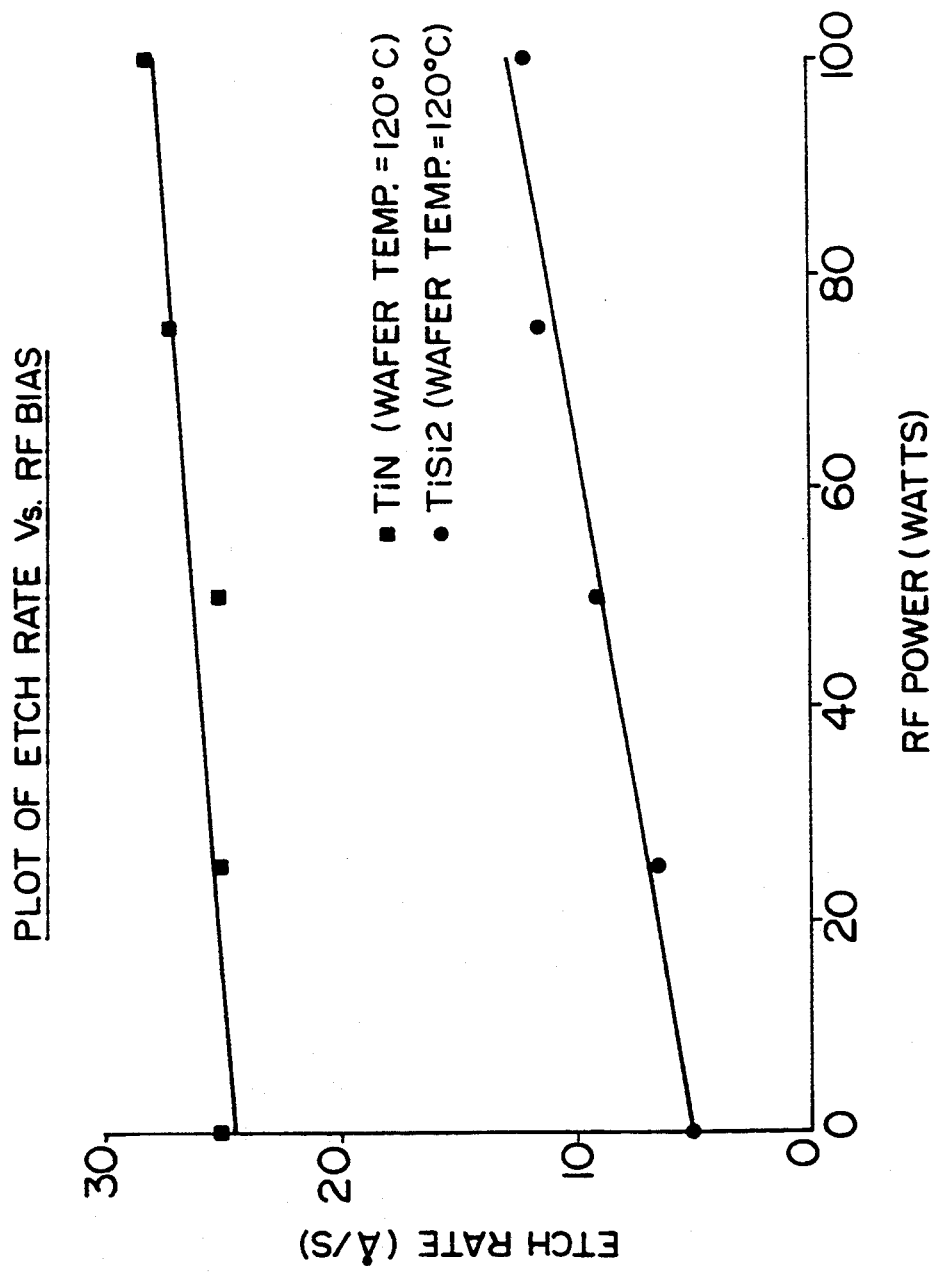
FIG. 2 shows a graphical representation of etch rate vs. RF power for the method according to the first embodiment.

The etch rate of TiN had a strong dependent on the RF power. The etch rate of TiN increased with increasing RF power on the substrate up to 100 W. However, as illustrated by the results shown in FIG. 2, the etch rate of titanium silicide increased more rapidly with increasing RF bias (FIG. 2). Thus, increasing the ion energy was found to increase the etch rate of silicide relative to titanium nitride, and thus the etch selectivity to TiN is reduced. (FIG. 2).

In an ECR plasma, the ion energy is related to the applied RF power. Ion energy increases as the RF power is increases. The ion energy is 10–20 eV when the RF bias is off. At RF power close to 100 watts, the ion energy is similar to that of a typical capacitatively coupled plasma systems, (>100 eV) The etch selectivity for TiN relative to $TiSi_2$ at an RF power or 100 W is similar (2:1) to that obtained in a conventional capacitatively coupled plasma system with ion energies >100 eV. In order to increase the selectivity, the ion energy is lowered, e.g. by using an ECR excited plasma with RF bias at the lower range shown figure two, or with no RF bias.

The etch rate was 150 nm/min for TiN with an etch rate ratio of 5:1 for $TiN:TiSi_2$ at ion energies of 10–20 eV, compared with ~2:1 at ion energies ~100 eV. The nitride is thus preferentially attacked and etched relative to the silicide at lower ion energies with increasing selectivity at lower ion energies. Thus improved selectivity is obtained at lower ion energies e.g. below 50 eV compared with etching at 100 eV or more, and even better selectivity at ion energies less than 30 eV when the RF bias is off. Thus, to increase the selectivity to increase the selectivity, the ion energy is lowered by operating an ECR etcher with low or no RF bias and pre-heating the substrate above 50° C.

The requirement for heating of the substrate is in contrast to a conventional plasma etch or reactive ion etch in which ion energies may be ~100 eV and where, typically, the substrate must be cooled on a chilled chuck to prevent overheating of the sample and loss of etch selectivity. On the other hand, it was found that etch selectivity in the present method was further enhanced by heating the substrate to ~100° C. to ~120° C. Increasing the temperature from 50° C. to 120° C. provided an increase in selectivity by a factor of about 2. Temperatures above 120° C. were not found to be advantageous in the present examples. It is believed that several temperature dependent factors may contribute to the latter effect: increased desorption of reactants from the surface competing with the TiN etch reactions; increased polymerization of TiN; and, lack of reactant supply, i.e. supply of fluorine radicals may be rate limiting on the etching reactions. Heating of the substrate by molecular nitrogen ion bombardment provided effective surface heating of the sample wafer while maintaining a low bulk wafer temperature and without causing significant sputtering damage to the surface.

Thus, reducing the ion energy by an order of magnitude compared with a conventional reactive ion etch, (i.e. from ~100 eV to ~10 eV) and increasing the etch temperature in an independent step produced a five fold improvement in etch selectivity for nitride over silicide. Superior selectivity of the etch process for TiN relative to $TiSi_2$ was obtained at low RF bias resulting in ion energies of less than 30 eV, or with the RF bias was turned off, ion energies 10–20 eV. Improved selectivity to other materials including oxide and photoresist was also obtained at lower RF bias or in the absence of RF bias.

Conveniently, the end point for TiN etching was detected by a change in optical emission from the plasma on completion of etching of exposed TiN. The high etch rate of TiN, 150 nm/min, resulted in a significant change in optical emission from the plasma when etching of TiN was completed, which facilitated end point detection.

In use of a ECR plasma excitation system, it is known the high efficiency of plasma generation results in efficient dissociation of $CF_4$ into F• and $CF_x$• (x=1,2,3) radicals. ECR plasma excitation of $CF_4$ was found to produce a plasma containing high concentrations of F• radicals for etching TiN, with a significant proportion of $CF_2$• and $CF_4$• as well as $CF_3$• radicals which are adsorbed on the silicide and function as passivant.

The plasma composition is completely different to a $CF_4$ plasma used for conventional reactive ion etching, and in contrast to degradation of selectivity by use of a plasma from a 'copious' fluorine or chlorine source, significantly higher selectivity between etch rates of TiN and $TiSi_2$ were found with plasma having a very high concentration of F from highly dissociated $CF_4$ when the ion energy was maintained below 30 eV. It is believed that this result is explained by a correspondingly high concentration of $CF_x$ radicals, which are produced by efficient dissociation of $CF_4$ by ECR excitation, so that the $[F^\bullet]/[CF_x^\bullet]$ ratio remains low, combined with the high adsorption coefficient of $CF_x^\bullet$ radicals on silicide to provide an effective passivation layer. Thus the silicide is masked from the etching effect of reactive $F^\bullet$ radicals. Furthermore, when the energy of the ions incident on the substrate is less than 30 eV, the ion energy is not high enough to significantly displace the passivating film of $CF_x$ radicals adsorbed on the silicide film. In contrast, in a conventional reactive ion etching plasma the degree of dissociation of the feed gas is lower, and hence the concentration of the $CF_x$ radicals is limited so that the passivation effect to the silicide film is relatively poor. Furthermore, the passivating layer of CFx is continually removed by bombardment with high energy ions from the plasma.

Moreover, since the concentration of reactive gas in the above described embodiments was not rate limiting, an inert carrier gas is not required, and further reduce ion bombardment effects during etching.

The method according to the first embodiment using a fluorine plasma generated from $CF_4$ may be used for selective etching of refractory metal nitrides including TiN, TiN containing oxygen or other elements, and tungsten nitride when the underlying silicide comprises a refractory metal silicide such as $TiSi_2$, $CoSi_2$, $PtSi_2$ or other silicides having volatile fluorides. An etch rate selectivity of 6:1 for TiN relative to an underlying film of $TiSi_2$ and 15:1 for TiN relative to an underlying film of $CoSi_2$ or $PtSi_2$ was obtained. The etch selectivity between TiN and photoresist was $\geq 7:1$ and between TiN and $SiO_2$ was $\geq 4:1$.

Thus, improved selectivity of a fluorine plasma for selective etching of TiN relative to photoresist and oxide, as well as $TiSi_2$, is advantageous in microelectronics applications, such as patterning of TiN local interconnect on underlying films of self aligned silicide contact regions for VLSI integrated circuits.

In a method according to a second embodiment of the present invention, the method is similar to that of the first embodiment, except that the plasma containing a reactive fluorine species is generated from a mixture of $CF_4$ and $C_2F_6$ and resulted in improved selectivity of the etch for TiN relative to $TiSi_2$.

In modifications of the embodiments of the invention, refractory metal nitrides are selectively etched relative to refractory metal silicides by exposing the substrate to reactive halogen species of low ion energy from plasmas generated from pure or mixed fluorocarbon gases including $CF_4$, $CHF_3$ and $C2F_6$, or chlorocarbon gases, such as $CCl_4$. However, since the fluoride of titanium is more volatile than the chloride, reactant gases containing fluorine are preferred for etching TiN. Fluorine species are also preferred to provide better selectivity with respect to photoresist and oxide. Chlorine containing etch gases may be avoided to reduce residue formation and contamination. For example, $CF_4$ is preferred over $CCl_4$ for microelectronics applications as it is readily obtainable in higher purity form, and is less toxic. Furthermore, use of $CCl_4$ has been discontinued in this laboratory in view of concern over environmental problems and health hazards associated with some chlorinated halocarbons.

In heating of the substrate wafer prior to etching by ion bombardment with an unreactive gas, nitrogen was preferred to minimize or reduce sputter damage to the substrate. The energy of ions used for heating was controlled by RF bias on the substrate holder to provide a suitable rate of heating to the desired substrate temperature for etching.

In an alternative embodiment, a conventional heating means comprising an electrically heated chuck in thermal contact with the substrate is used for heating the substrate.

Although an ECR excited plasma etch system is advantageous in providing independent control of ion energy and ion flux, a method according to the invention may be carried out in other types of etching apparatus capable of generating low energy reactive ions in a selected range of energies, that is in an inductively coupled (helicon or transversely coupled) plasma with low or no RF bias applied.

Thus in a method of selectively etching titanium nitride local interconnect according to a third embodiment of the present invention, the substrate placed in a magnetron etching system, and pre-heated the substrate to 120° C. by means of a heated chuck. Then a reactive fluorine plasma was generated from a halocarbon gas consisting of $CF_4$ which was introduced into the chamber, at a flow rate about 50 sccm, a pressure of 40 mTorr, 80 Gauss magnetic field, and 100 Watts power. The resulting etch rate was about 1000 Å per minute. The ion energy of the reactive fluorine species in this system was less than 50 eV.

In a method of etching titanium nitride according to a fourth embodiment of the present invention, instead of using a magnetically confined plasma chamber, the sample is etched using a down stream plasma etcher, e.g. a photoresist stripper, with or without application of RF bias to the substrate. The substrate is pre-heated to about 100° C. to 120° C. as in the other embodiments, and the ion energy is advantageously restricted to a range less than 50 eV, and preferably to less than 30 eV by applying low RF or zero RF bias to the substrate. The etch may be carried out in a downstream plasma etch mode in a barrel type etch apparatus, which is equipped with independent heater control on heated substrate holders, to preheat the substrate to about 100° C. before exposure to a reactive plasma species generated from $CF_4$, $C_2F_6$ or mixtures thereof.

Thus there is provided an improved etch process for selective etching of refractory metal silicides comprising controlling etch selectivity by selecting the ion energy of the reactive halogen species in the plasma in a predetermined low energy range, and independently controlling the etch temperature in a separate heating step.

Consequently, a method of etching refractory metal nitrides with improved selectivity relative to refractory metal silicides and other integrated substrate materials. The feasibility of using refractory metal nitrides, and in particular TiN for local interconnect is much improved. Restriction of the reactive ion energy to lower ion energies than found in conventional RIE and plasma etch systems improves selectivity and reduces plasma damage, and ion bombardment effects, for improved reliability of the conductive interconnect material and underlying materials.

What is claimed is:

1. A method of selectively etching a layer of refractory metal nitride relative to an underlying layer of refractory metal silicide comprising part of a substrate of an integrated circuit, the method comprising:

heating surfaces of the substrate in a non-reactive gas to a selected etch temperature between 50° C. and 200° C. in an etching chamber;

generating a plasma from a halocarbon feed gas, the plasma comprising chemically reactive halogen species having ion energies in a range substantially below 100 eV;

exposing the heated surface of the substrate to said chemically reactive halogen species of the plasma at said selected etch temperature, thereby selectively removing the layer of refractory metal nitride from the underlying refractory metal silicide and the underlying substrate, the etch selectivity for the refractory metal nitride relative to the refractory metal silicide and substrate being controlled by selecting a relatively low ion energy whereby ion bombardment and heating effects during etching are reduced, and independently controlling the etch temperature by said heating step.

2. A method according to claim 1 wherein the substrate is exposed to reactive halogen species having ion energies in the range below 50 eV.

3. A method according to claim 1 wherein the substrate is exposed to reactive halogen species having ion energies in the range below 30 eV.

4. A method according to claim 1 wherein the reactive halogen species are incident on the substrate with ion energies in the range 10–20 eV.

5. A method according to claim 1 wherein the step of heating the substrate comprises ion bombardment with a non-reactive gas in the etching chamber.

6. A method according to claim 1 comprising:

heating the substrate by ion bombardment within an ECR plasma etching system; and then generating the plasma by ECR excitation of the halocarbon containing feed gas within the ECR plasma etching system and exposing the heated substrate to the reactive halogen species of the plasma.

7. A method according to claim 1 wherein the step of heating surface of the substrate by ion bombardment comprises application of an RF field to accelerate ions of the non-reactive gas towards the substrate during said heating step, and subsequently the RF bias is reduced or turned off during exposure of the substrate to the reactive halogen species of the plasma whereby etching takes place by reactive species of a relatively low ion energy.

8. A method according to claim 1 wherein the halocarbon is selected from group of fluorocarbons and chlorocarbons.

9. A method according to claim 1 wherein the halocarbon is selected from the group consisting of $CF_4, C_2F_6$, and mixtures thereof.

10. A method according to claim 1 wherein the chemically reactive halogen species comprises fluorine radicals.

11. A method according to claim 1 wherein the halocarbon containing gas consists of $CF_4$ only and the fluorine radicals are generated by dissociation of $CF_4$ within the plasma to produce at least $F°$ and $CF_x^\bullet$ radical.

12. A method according to claim 11 wherein the plasma comprises $CF_x^\bullet$ radical ions where x = 1, 2 or 3.

13. A method according to claim 6 wherein the halocarbon containing gas comprises $C_2F_6$.

14. A method according to claim 11 wherein the substrate surface is heated to an etch temperature between 100° C. and 120° C.

15. A method according to claim 1 comprising providing a substrate comprising a refractory metal nitride layer overlying a layer of a silicide of the group of refractory metals including Ti, Pt and Co.

16. A method according to claim 1 wherein the substrate is provided with a refractory metal nitride layer comprising a compound predominantly of titanium and nitrogen.

17. A method of forming a refractory metal nitride interconnect structure for an integrated circuit, the method comprising:

providing a substrate of an integrated circuit comprising a layer of a refractory silicide and an overlying layer of refractory metal nitride;

selectively masking the refractory metal nitride layer with a masking layer;

exposing the substrate in an etching chamber;

preheating surfaces of the substrate to a selected etch temperature between 50° C. and 200° C. in an unreactive gas;

generating a plasma from a halocarbon feed gas, the plasma comprising reactive halogen species having ion energies in a range substantially less than 100 eV;

and exposing the heated substrate to said reactive halogen species of the plasma at the selected etch temperature, thereby selectively removing unmasked areas of the layer of refractory metal nitride from the underlying layer of refractory metal silicide and underlying substrate.

the etch selectivity of the reactive species of the plasma for the refractory metal nitride relative to the refractory metal substrate, the underlying substrate and the masking layer being controlled by selecting a relatively low ion energy whereby ion bombardment and heating effects during etching are reduced and independently controlling the selected etch temperature in said preheating step.

18. A method according to claim 17 wherein the substrate is exposed to reactive halogen species have ion energies in a range below 50 eV.

19. A method according to claim 17 wherein the substrate is exposed to reactive halogen species have ion energies in a range below 30 eV.

20. A method according to claim 17 wherein the reactive halogen species are incident on the substrate with ion energies in the range 10–20 eV.

21. A method according to claim 17 wherein the halocarbon comprises a fluorocarbon.

22. A method according to claim 17 wherein the fluorocarbon is selected from the group consisting $CF_4, C_2F_6$, and $CHF_3$, and mixtures thereof.

23. A method according to claim 17 comprising heating the substrate by ion bombardment within an ECR plasma etching system and then, generating the plasma by ECR excitation of the halocarbon containing feed gas within the ECR plasma etching system, and exposing the heated substrate to reactive halogen species of the plasma having ion energies in said selected energy range.

24. A method according to claim 17 comprising selectively masking the refractory metal nitride layer with photoresist before exposing selected areas of the refractory metal nitride layer to the plasma.

25. A method according to claim 24 wherein selectively masking the refractory metal nitride layer comprises coating the substrate with photoresist and patterning the photoresist.

26. A method according to claim 17 wherein providing said substrate comprises the step of forming a silicide layer comprising titanium silicide, and depositing an overlying layer of a conductive refractory metal nitride compound comprising predominantly titanium and nitrogen.

27. A method of etching titanium nitride relative to an underlying layer of a refractory metal silicide comprising part of a substrate of an integrated circuit, comprising:

exposing the substrate in an etching chamber and heating surfaces of the substrate to a selected etch temperature between 50° C. and 200° C.;

generating a plasma from a halocarbon gas selected from the group consisting $CF_4, C_2F_6$, and mixtures thereof, the plasma comprising reactive fluorine species having ion energies in a range substantially below 100 eV, and exposing the heated substrate at the selected etch temperature to said reactive fluorine species, thereby selectively etching the layer of titanium nitride relative to the refractory metal silicide, the etch selectivity increasing at lower ion energies whereby an optimum etch selectivity is controlled by selecting a lower range of ion energy whereby heating effects and ion bombardment effects during etching are reduced, and independently controlling the etch temperature in said heating step.

* * * * *